(12) United States Patent
Kang

(10) Patent No.: US 8,039,762 B2
(45) Date of Patent: Oct. 18, 2011

(54) PRINTED CIRCUIT BOARD HAVING A BURIED SOLDER BUMP AND A CIRCUIT LAYER FLUSH WITH AN INSULATING LAYER

(75) Inventor: Myung Sam Kang, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 395 days.

(21) Appl. No.: 12/379,056

(22) Filed: Feb. 11, 2009

(65) Prior Publication Data

US 2010/0116536 A1    May 13, 2010

(30) Foreign Application Priority Data

Nov. 12, 2008 (KR) .......................... 10-2008-0112359

(51) Int. Cl.
*H05K 1/11* (2006.01)
(52) U.S. Cl. ....................................................... 174/264
(58) Field of Classification Search .......... 174/257–264; 257/738, 774; 361/761, 774; 156/230, 237, 156/252
See application file for complete search history.

(56) References Cited

U.S. PATENT DOCUMENTS

| | | | | |
|---|---|---|---|---|
| 4,706,167 A | * | 11/1987 | Sullivan | 361/774 |
| 5,261,989 A | * | 11/1993 | Ueltzen | 156/252 |
| 5,384,689 A | * | 1/1995 | Shen | 361/761 |
| 7,906,850 B2 | * | 3/2011 | Wang et al. | 257/774 |
| 2007/0182379 A1 | * | 8/2007 | Ueda et al. | 320/137 |
| 2008/0314633 A1 | * | 12/2008 | Kang et al. | 174/264 |

FOREIGN PATENT DOCUMENTS

| | | |
|---|---|---|
| JP | 59-46094 | 3/1984 |
| JP | 08-204333 | 8/1996 |
| JP | 2002-076598 | 3/2002 |
| JP | 2004-047898 | 2/2004 |

OTHER PUBLICATIONS

Japanese Office Action issued Oct. 26, 2010 in corresponding Japanese Patent Application 2009-030733.

* cited by examiner

*Primary Examiner* — Chandrika Prasad (57) ABSTRACT

Disclosed is a printed circuit board having a buried solder bump, in which a circuit pattern and a solder bump formed on the circuit pattern are buried in an insulating layer, thus improving the degree of matching between the solder bump and the circuit pattern and obviating a need for an additional coining process of the solder bump. A manufacturing method thereof is also provided.

5 Claims, 6 Drawing Sheets

FIG.1

Prior Art

PRINTED CIRCUIT BOARD HAVING A BURIED SOLDER BUMP AND A CIRCUIT LAYER FLUSH WITH AN INSULATING LAYER

CROSS REFERENCE TO RELATED APPLICATION

This application claims the benefit of Korean Patent Application No. 10-2008-0112359, filed Nov. 12, 2008, entitled "A printed circuit board having buried solder bump and a manufacturing method of the same", which is hereby incorporated by reference in its entirety into this application.

BACKGROUND OF THE INVENTION

1. Field of the Invention

The present invention relates to a printed circuit board (PCB) having a buried solder bump and a manufacturing method thereof.

2. Description of the Related Art

With the recent advancement of electronics industries, there is a demand for increasing performance and functionality of electronic components and reducing the size thereof. Accordingly, high integration, slimness and fine circuit patterning are also required on a substrate for surface mounting components, such as SIP (System in Package), 3D package, etc.

In particular, in techniques for mounting electronic components on the surface of a substrate, a wire bonding process or a flip chip bonding process is utilized for electrical connection between a semiconductor chip and a PCB.

The wire bonding process includes bonding a semiconductor chip having design circuits to a PCB using an adhesive, connecting a lead frame of the PCB to a metal terminal (i.e., pad) of the semiconductor chip using a metal wire to transmit and receive information therebetween, and molding the electronic device and the wire with thermosetting resin or thermoplastic resin.

The flip chip bonding process includes forming an external connection terminal (i.e., bump) having a size of tens of μm to hundreds of μm on a semiconductor chip using a material such as gold, solder or another metal, and flipping the semiconductor chip having the bump so that the surface thereof faces the substrate and is thus mounted on the substrate, unlike the mounting operation based on the wire bonding.

Although the wire bonding process has higher productivity compared to other packaging processes, it needs wires for connection to the PCB, and thus the size of a module is increased and an additional procedure is required. Hence, the flip chip bonding process is mainly employed.

Figure 1:
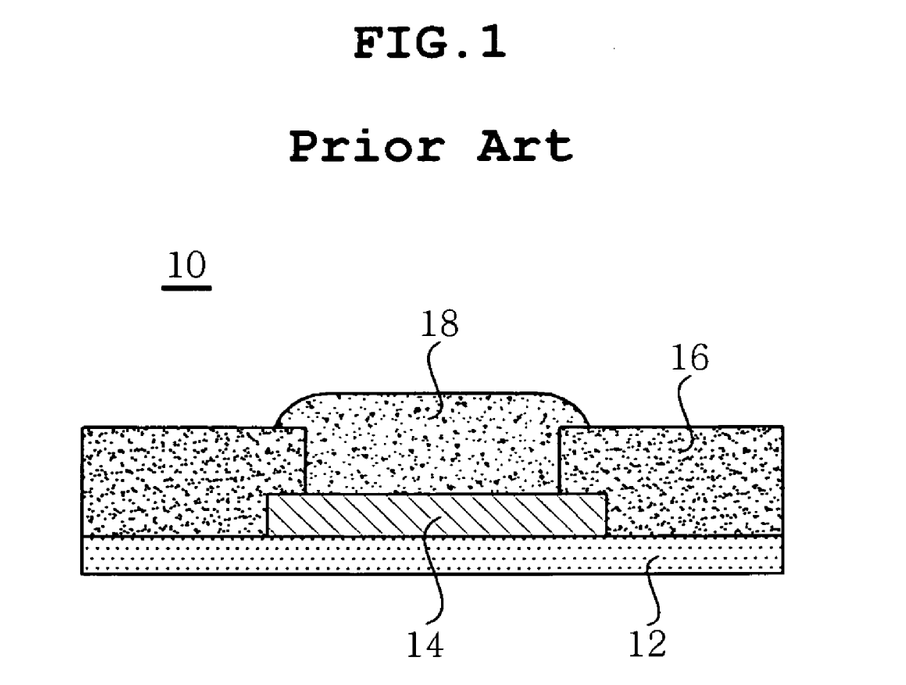
FIG. 1 is a cross-sectional view showing a PCB having a solder bump for use in flip chip bonding according to a conventional technique.

FIG. 1 is a cross-sectional view showing a PCB having a solder bump for use in flip chip bonding according to a conventional technique.

As shown in FIG. 1, the PCB 10 for flip chip bonding according to the conventional technique includes an insulating layer 12, a pad formed on the insulating layer 12, a solder resist layer 16 having an opening for exposing the pad 14, and a solder bump 18 formed on the pad 14 to dispose it between the PCB 10 and a semiconductor chip so as for electrical connection therebetween.

However, the PCB for flip chip bonding according to the conventional technique and the manufacturing method thereof have the following problems.

Because the pad 14 which is formed on the insulating layer 12 is exposed by the opening formed in the solder resist layer 16, height difference between the pad 14 and the solder resist layer 16 may be caused, and thereby the degree of matching between the solder bump 18 and the pad 14 is lowered, undesirably decreasing bonding reliability.

Also, when the pad 14 is formed on the high-density substrate through a plating process, deviations in height of the pad 14 may be caused by plating tolerance. So, in the case where the amount of solder to be printed is small, problems in which the solder bump 18 is not connected to the semiconductor chip may occur.

Also, in the course of forming the opening in the solder resist layer 16 to expose the pad 14, height difference occurs between the pad 14 and the opening, and thus the printing of the solder bump 18 becomes non-uniform.

Also, in order to ensure electrical connection reliability between the semiconductor chip and the PCB 10, a coining process for flattening the upper surface of the solder bump 18 to result in a uniform height should be conducted. Because the coining process is performed for each unit, a lead time is undesirably lengthened.

SUMMARY OF THE INVENTION

Accordingly, the present invention has been made keeping in mind the problems encountered in the related art and the present invention provides a PCB having a buried solder bump, which is able to improve the degree of matching between a solder bump and a circuit pattern, and a manufacturing method thereof.

In addition, the present invention provides a PCB having a buried solder bump, in which a circuit pattern is buried to be flush with the surface of an insulating layer, and thus deviations in height due to plating tolerance do not occur, thereby improving connection reliability between the semiconductor chip and the solder bump, and a manufacturing method thereof.

In addition, the present invention provides a PCB having a buried solder bump, in which an opening formed in a solder resist layer causes no height difference from a circuit pattern and a solder bump, and a manufacturing method thereof.

In addition, the present invention provides a PCB having a buried solder bump, which obviates a need for a coining process of a solder bump, and a manufacturing method thereof.

According to a preferred embodiment of the present invention, a PCB having a buried solder bump includes an insulating layer, a solder bump buried in the insulating layer to be flush with a surface of the insulating layer, a circuit pattern formed on a lower surface of the solder bump, and a circuit layer connected to the circuit pattern and buried in the insulating layer to be flush with the surface of the insulating layer.

The total height of the solder bump and the circuit pattern may equal the height of the circuit layer.

The solder bump may have a flat surface structure.

The solder bump may be formed with tin, an alloy of tin and silver, or a solder paste.

Also, a solder resist layer having an opening for exposing the solder bump may be formed on the insulating layer.

According to another preferred embodiment of the present invention, a method of manufacturing a PCB having a buried solder bump includes (A) preparing a carrier on which a circuit layer, a solder bump, and a circuit pattern formed on the solder bump are formed, (B) pressing the carrier into an insulating layer so that the circuit layer, the solder bump and the circuit pattern are buried in the insulating layer, and (C) removing the carrier.

In the above method, (A) preparing the carrier may include (A1) applying a first photoresist on the carrier and then patterning the first photoresist to have an opening for forming a circuit, (A2) forming a copper plating layer in the opening for forming a circuit and then applying a second photoresist, (A3) forming a window in a portion of the first photoresist corresponding to a bump forming region and then removing the copper plating layer exposed by the window, thus forming the circuit layer and the opening for forming a bump, and (A4) sequentially forming the solder bump and the circuit pattern in the opening for forming a bump and then removing the first photoresist and the second photoresist.

Also, in (A2) the second photoresist may be formed on the first photoresist and the copper plating layer.

Also, in (A3) the window may be formed through irradiation of a laser.

Also, in (A4) the solder bump may be formed through a plating process using tin or an alloy of tin and silver.

Also, in (A4) the solder bump may be formed through a filling process using a solder paste.

The above method may further include (D) forming a solder resist layer having an opening for exposing the solder bump, after (C) removing the carrier.

The total height of the solder bump and the circuit pattern may equal the height of the circuit layer.

The solder bump may have a flat surface structure.

The features and advantages of the present invention will be more clearly understood from the following detailed description taken in conjunction with the accompanying drawings.

Further, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

DESCRIPTION OF THE PREFERRED EMBODIMENTS

The features and advantages of the present invention will be more clearly understood from the following detailed description and preferred embodiments taken in conjunction with the accompanying drawings. In the description, the terms "first", "second" and so on do not indicate any particular amount, sequence or importance, but are used only to distinguish one element from another element. Throughout the drawings, the same reference numerals refer to the same or similar elements, and redundant descriptions are omitted. In order to make the characteristics of the invention clear and for the convenience of description, a detailed description pertaining to the other known techniques may be omitted.

Hereinafter, a detailed description will be given of preferred embodiments of the present invention, with reference to the accompanying drawings.

PCB Having Buried Solder Bump

Figure 2A:
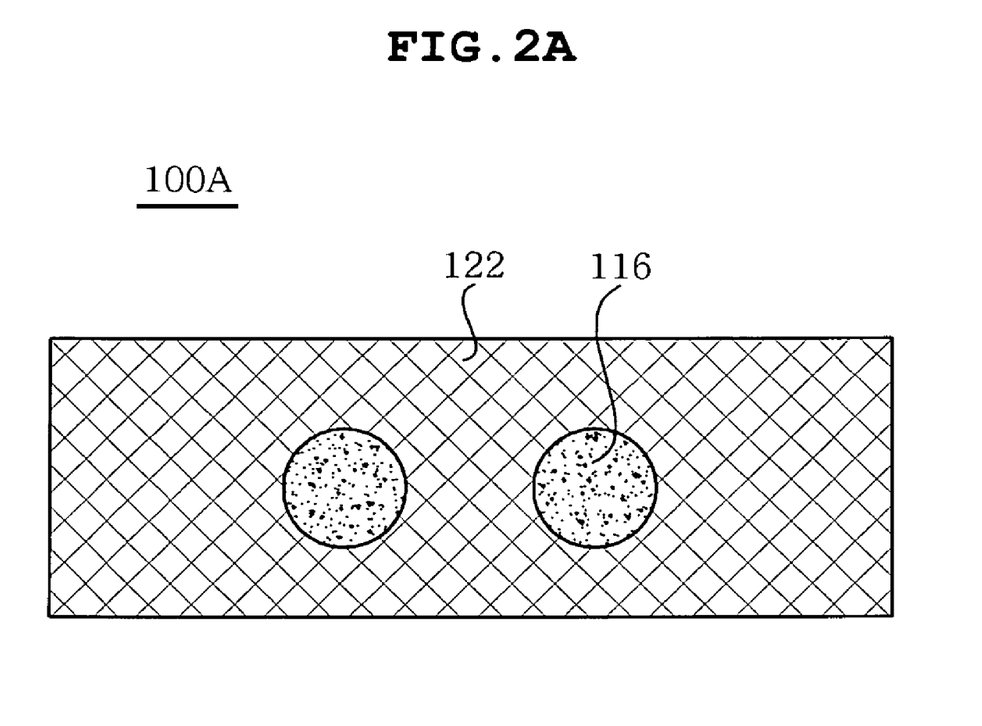
FIGS. 2A and 2B are a top plan view and a cross-sectional view showing a PCB having a buried solder bump according to a first preferred embodiment of the present invention.
Figure 2B:
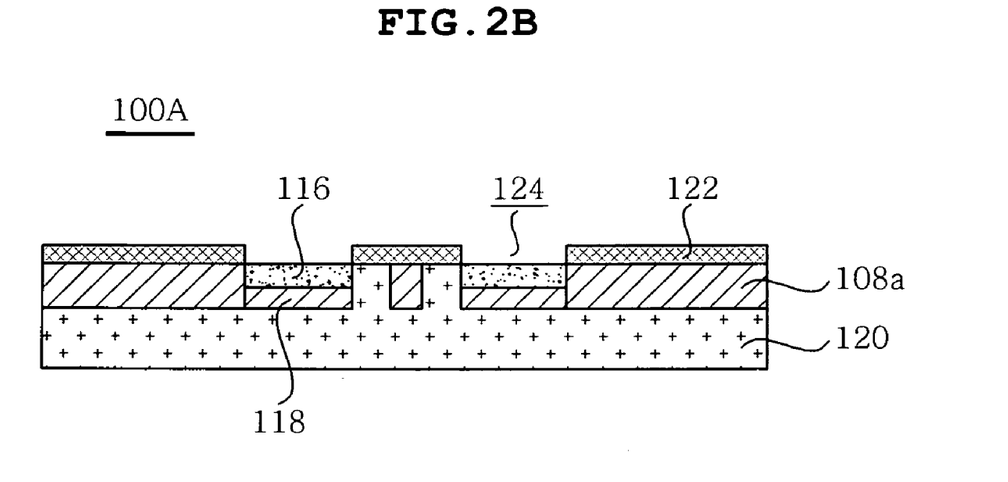
Figure 3A:
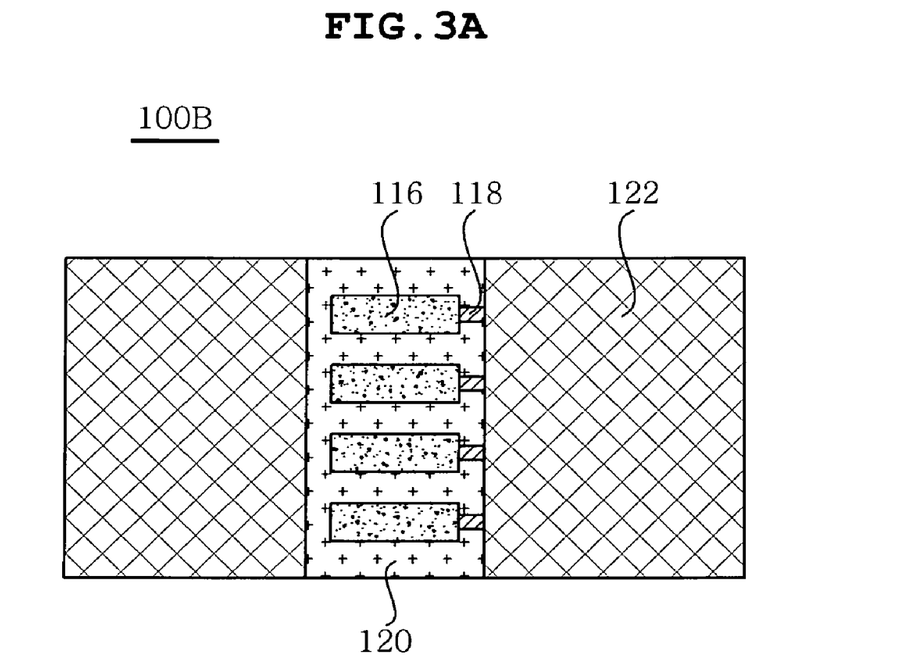
FIGS. 3A and 3B are a top plan view and a cross-sectional view showing a PCB having a buried solder bump according to a second preferred embodiment of the present invention.
Figure 3B:
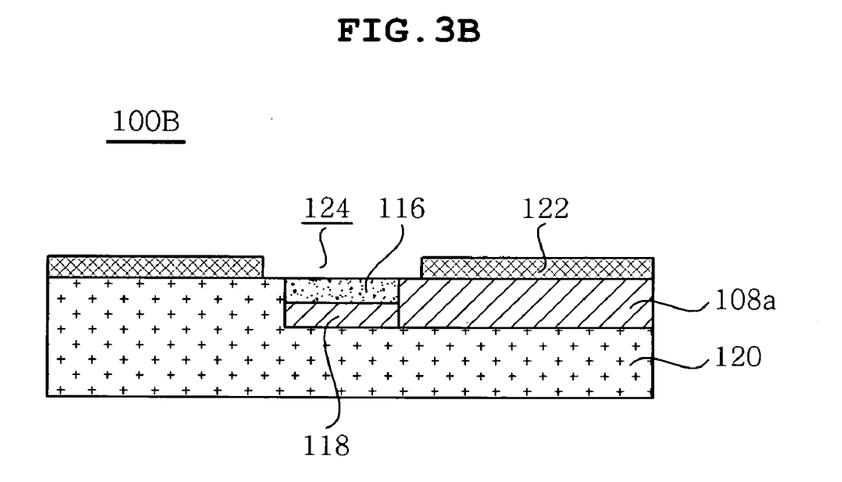

FIGS. 2A and 2B are a top plan view and a cross-sectional view showing a PCB having a buried solder bump according to a first preferred embodiment of the present invention, and FIGS. 3A and 3B are a top plan view and a cross-sectional view showing a PCB-having a buried solder bump according to a second preferred embodiment of the present invention.

With reference to the above drawings, the PCB 100A, 100B having a buried solder bump according to the preferred embodiments of the present invention is described below.

As seen in FIGS. 2A and 2B, the PCB 100A having a buried solder bump according to the first preferred embodiment of the present invention includes an insulating layer 120, a solder bump 116 which is buried in the insulting layer 120 to be flush with the surface of the insulating layer 120, a circuit pattern 118 formed on the lower surface of the solder bump 116, and a circuit layer 108a connected to the circuit pattern 118 and buried in the insulting layer 120 to be flush with the surface of the insulating layer 120. The PCB according to the present embodiment is provided in the form of an area array type flip chip bonding pad structure.

As such, the circuit pattern 118, the solder bump 116 formed on the circuit pattern 118, and the circuit layer 108a are buried in the insulting layer 120, in a state in which the total height of the circuit pattern and the solder bump equals the height of the circuit layer.

The solder bump 116 is provided to be flush with the surface of the insulating layer 120 and thus has a flat surface structure, and is formed with tin (Sn), a tin/silver alloy, or a solder paste.

On the insulating layer 120, a solder resist layer 122 having an opening 124 for exposing the solder bump 116 is formed.

That is, the PCB according to the present embodiment is configured such that the solder bump 116 is buried in the insulating layer 120 to be flush with the surface of the insulating layer 120, thus obviating a need for an additional coining process. Also, the solder resist layer 122 may be formed thin, and the opening 124 of the solder resist layer 122 causes no height difference from the solder bump.

With reference to FIGS. 3A and 3B, the PCB 100B having a buried solder bump according to the second preferred embodiment of the present invention is similarly configured to the PCB 100A having a buried solder bump according to the first preferred embodiment, with the exception that the PCB 100B is provided in the form of a peripheral type flip chip bonding pad structure, and thus the detailed description thereof is omitted.

Method of Forming Carrier Having Solder Bump and Circuit Pattern

FIGS. 4 to 10 are cross-sectional views showing the process of preparing a carrier having the solder bump and the circuit pattern according to the preferred embodiment of the present invention.

With reference to the above drawings, the method of preparing the carrier having the solder bump 116 and the circuit pattern 118 according to the present invention is described below.

Figure 4:
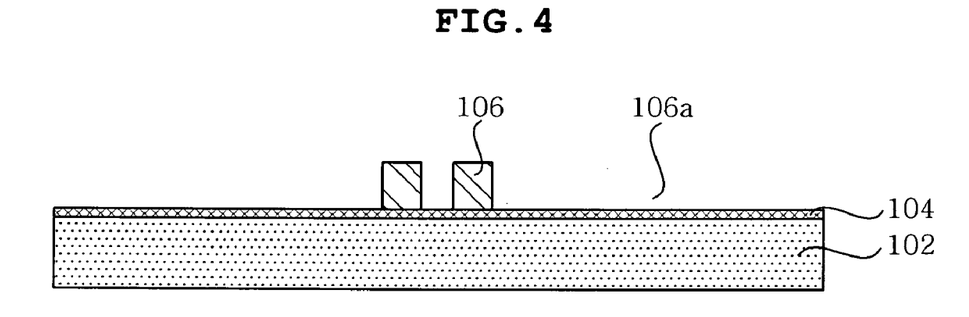
FIGS. 4 to 10 are cross-sectional views showing the process of preparing a carrier having a solder bump and a circuit pattern according to the preferred embodiment of the present invention.

As shown in FIG. 4, a first photoresist 106 is applied on a carrier including a metal base 102 and a metal barrier layer 104 formed thereon, after which the first photoresist 106 is patterned to have an opening 106a for forming a circuit through exposure/development.

The first photoresist 106 may include a photoresist in a liquid state or a dry film resist.

On the metal barrier layer 104 of the carrier, a seed layer (not shown) may be formed through electroless copper plating or sputtering.

Figure 5:
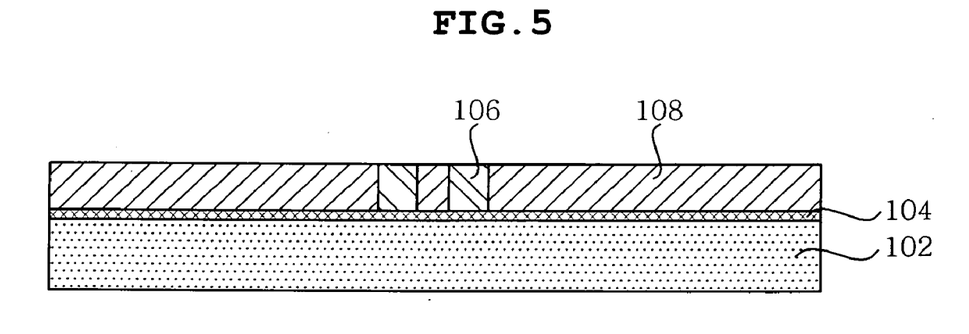

Next, as shown in FIG. 5, a copper plating layer 108 is formed in the opening 106a for forming a circuit through copper electroplating.

The copper plating layer 108 may be formed to be flush with the first photoresist 106. After the formation of the copper plating layer 108, the first photoresist 106 still remains without peeling off.

Figure 6:
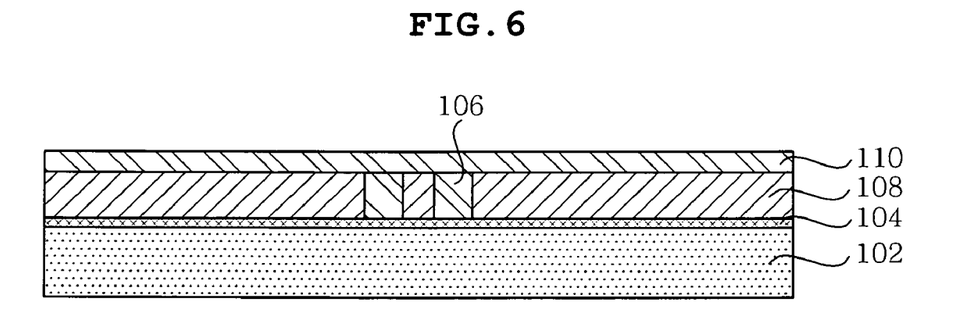

Next, as shown in FIG. 6, a second photoresist 110 is applied on the copper plating layer 108 and the first photoresist 106.

The second photoresist 110 may include a photoresist in a liquid state or a dry film resist.

Figure 7:
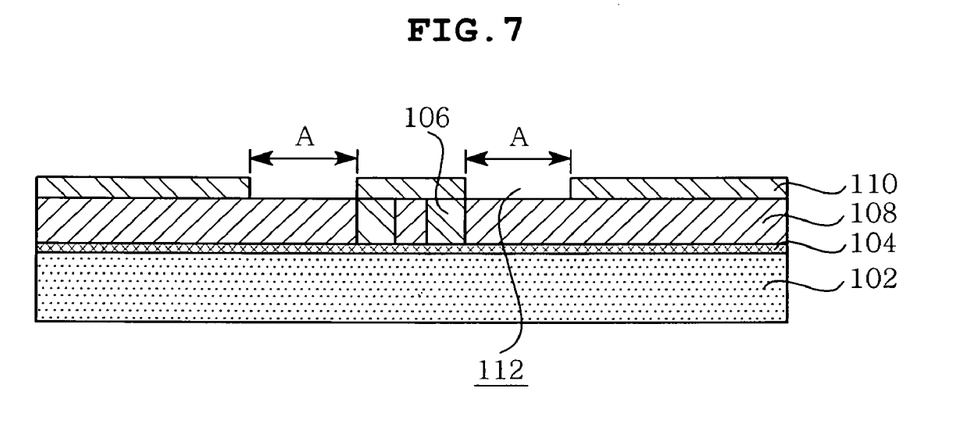

Next, as shown in FIG. 7, a window 112 is formed in a portion of the second photoresist corresponding to a solder bump forming region A.

The window 112 may be processed through irradiation of a laser such as CO2 laser or YAG laser, or may be formed through exposure and development using a mask having a pattern corresponding to the window. In the case where the window 112 is formed through irradiation of a laser, the size of the laser beam is controlled, thus adjusting the size of the window. Alternatively, in the case where the window 112 is formed using a mask, the size of the window may be adjusted through control of the pattern of the mask.

Figure 8:
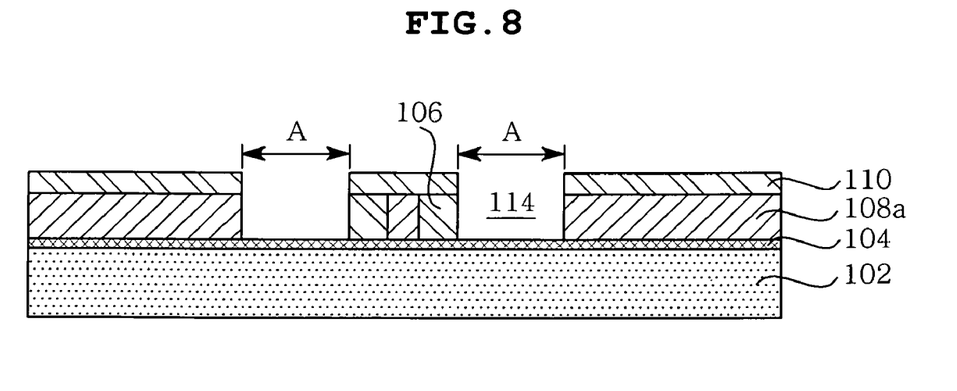

Next, as shown in FIG. 8, the copper plating layer 108 of the solder bump forming region A exposed by the window 112 is be removed through etching, thus forming an opening 114 for forming the solder bump 116 and the circuit pattern 118.

The copper plating layer which is not removed but remains through the etching process plays a role as circuit layer 108a.

Figure 9:
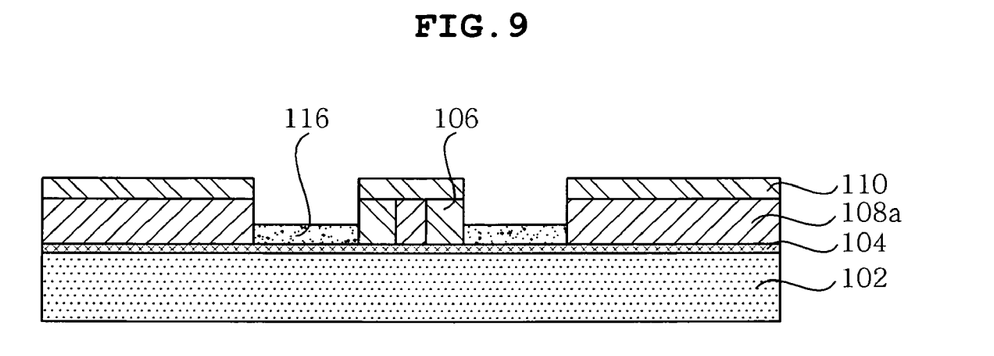

Next, as shown in FIG. 9, the solder bump 116 is formed in part of the opening 114.

The solder bump 116 is formed to be lower than the circuit layer 108a and the side thereof is brought into contact with the circuit layer 108a.

The solder bump 116 may be formed through a plating process using tin (Sn) or a tin/silver (Sn/Ag) alloy, or through a filling process using a solder paste.

Figure 10:
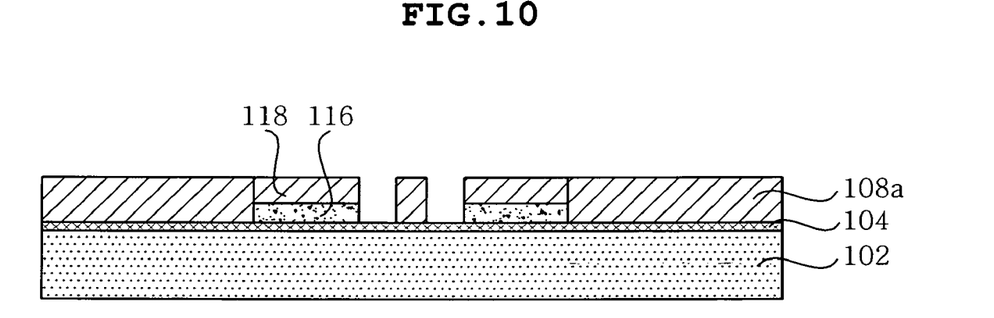

Next, as shown in FIG. 10, the circuit pattern 118 is formed on the solder bump 116 in the opening 114, and the first photoresist 106 and the second photoresist 110 are stripped, thus preparing the carrier having the solder bump 116 and the circuit pattern 118.

The circuit pattern 118 is formed in the opening 114 through a plating process so as to be flush with the circuit layer 108a, and the side surface thereof is brought into contact with the circuit layer 108a, thus realizing electrical connection.

Method of Manufacturing PCB Having Buried Solder Bump

FIGS. 11 to 14 are cross-sectional views showing the process of manufacturing the PCB having a buried solder bump according to the preferred embodiment of the present invention.

With reference to the above drawings, the method of manufacturing the PCB having a buried solder bump according to the present invention is described below.

Figure 11:
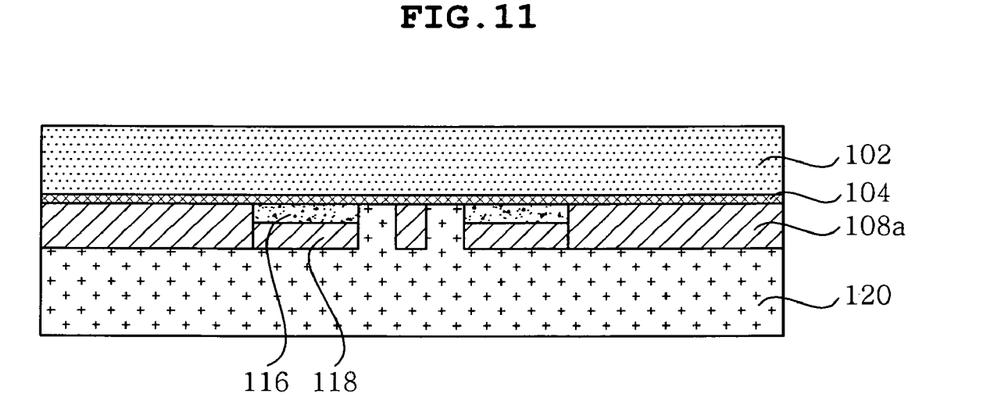
FIGS. 11 to 14 are cross-sectional views showing the process of manufacturing the PCB having a buried solder bump according to the preferred embodiment of the present invention.

As shown in FIG. 11, the carrier is pressed into the insulating layer 120, and thus the solder bump 116 and the circuit pattern 118 is incorporated therein.

The incorporation process may be performed by pressing the carrier into the insulating layer 120 while heating the insulating layer 120 to a temperature higher than a softening point. As such, a press carrier (not shown) may be placed on the other surface of the insulating layer 120 so that the same pressure is applied to the insulating layer.

FIG. 11 illustrates the solder bump 116 and the circuit pattern 118 which are incorporated only into one surface of the insulating layer 120 by pressing the carrier into one surface of the insulating layer 120, but the case where two carriers are incorporated into both surfaces of the insulating layer respectively may be included in the scope of the present invention.

Figure 12:
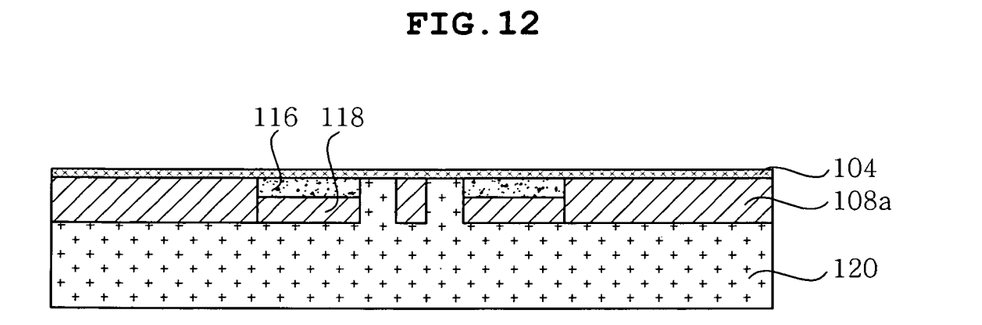
Figure 13:
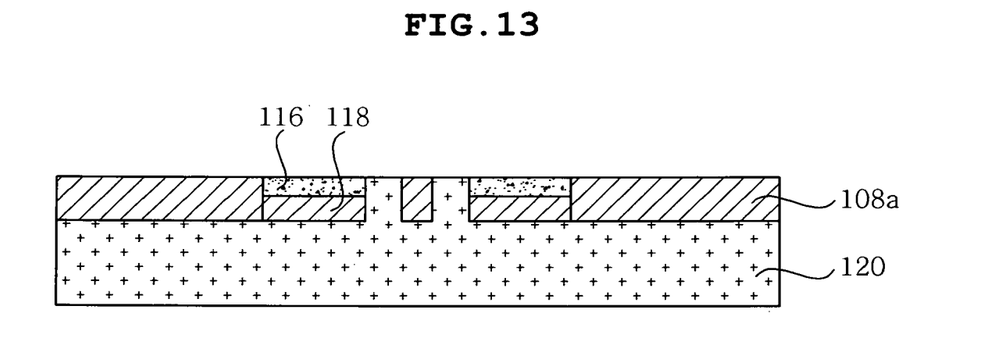

Next, as shown in FIGS. 12 and 13, the metal base 102 and the metal barrier layer 104 are removed.

The metal base 102 and the metal barrier layer 104 may be removed through etching. As such, because these two layers are formed of different metals, they may be removed using different etchants.

Figure 14:
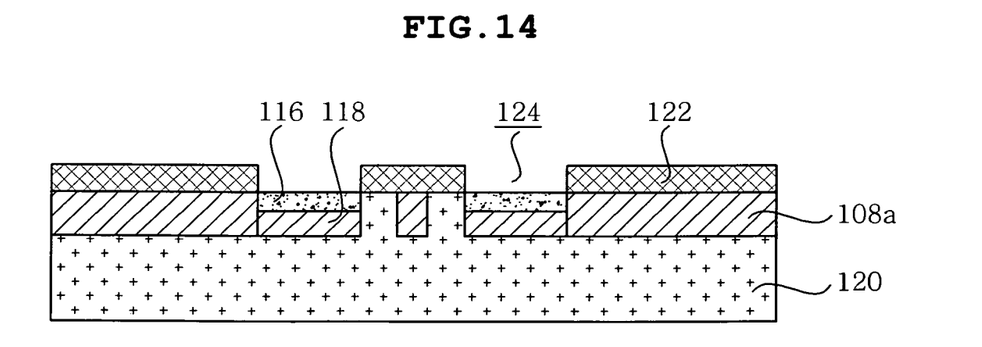

Finally, as shown in FIG. 14, the solder resist layer 122 is formed on the insulating layer 120, and an opening 124 for exposing the solder bump 116 is formed.

The opening 124 may be formed through a mechanical process such as LDA (Laser Direct Ablation).

Thereby, the PCB 100A having the buried solder bump as shown in FIGS. 2A and 2B can be manufactured. The method of manufacturing the PCB 100B having the buried solder bump as shown in FIGS. 3A and 3B may also be easily derived from the aforementioned manufacturing process by one skilled in the art, and thus a detailed description thereof is omitted.

As described hereinbefore, the present invention provides a PCB having a buried solder bump and a manufacturing method thereof. According to the present invention, the solder bump is formed on a circuit pattern which is buried and is also buried to be flush with the surface of an insulating layer, thus improving the degree of matching between the solder bump and the circuit pattern.

Also, according to the present invention, the circuit pattern is buried, and thus deviations in height due to plating tolerance do not occur, thereby improving the connection reliability between the semiconductor chip and the solder bump.

Also, according to the present invention, the circuit pattern and the solder bump are buried, and thus cause no height difference from the opening formed in the solder resist layer.

Also, according to the present invention, the solder bump is buried to be flush with the surface of the insulating layer, thus obviating a need for an additional coining process thereof, thereby reducing a lead time.

Also, according to the present invention, the solder bump is buried, and thus the solder resist layer can be formed thin, thereby enabling slimness of products and reduction of material expenses.

Although the preferred embodiments of the present invention regarding the PCB having a buried solder bump and the manufacturing method thereof have been disclosed for illustrative purposes, those skilled in the art will appreciate that various modifications, additions and substitutions are possible within the scope of the invention.

What is claimed is:

1. A printed circuit board having a buried solder bump, comprising:
an insulating layer;

a solder bump buried in the insulating layer and having a top surface flush with a top surface of the insulating layer;

a circuit pattern formed on a lower surface of the solder bump; and a circuit layer connected to the circuit pattern and buried in the insulating layer and having a top surface flush with the top surface of the insulating layer.

2. The printed circuit board as set forth in claim 1, wherein a total height of the solder bump and the circuit pattern equals a height of the circuit layer.

3. The printed circuit board as set forth in claim 1, wherein the solder bump has a flat surface structure.

4. The printed circuit board as set forth in claim 1, wherein the solder bump is formed with tin, an alloy of tin and silver, or a solder paste.

5. The printed circuit board as set forth in claim 1, wherein a solder resist layer having an opening for exposing the solder bump is formed on the insulating layer.

* * * * *